US007018880B2

(12) United States Patent
Hao et al.

(10) Patent No.: US 7,018,880 B2
(45) Date of Patent: Mar. 28, 2006

(54) METHOD FOR MANUFACTURING A MOS TRANSISTOR HAVING REDUCED 1/F NOISE

(75) Inventors: Pinghai Hao, Plano, TX (US); Larry B. Anderson, Santa Cruz, CA (US); Fan Chi Hou, McKinney, TX (US); Xiaoju Wu, Irving, TX (US); Yvonne Patton, Plano, TX (US); Shanjen Pan, Plano, TX (US); Zafar Imam, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 8 days.

(21) Appl. No.: 10/744,549

(22) Filed: Dec. 22, 2003

(65) Prior Publication Data

US 2005/0136579 A1 Jun. 23, 2005

(51) Int. Cl.
*H01L 21/336* (2006.01)
*H01L 21/8234* (2006.01)

(52) U.S. Cl. ...................................... 438/197; 438/290

(58) Field of Classification Search ................ 438/197, 438/217, 276, 278, 290, 514

See application file for complete search history.

(56) References Cited

U.S. PATENT DOCUMENTS 5,831,319 A * 11/1998 Pan ............................ 257/408

(Continued)

OTHER PUBLICATIONS

Natallya Lukyanchikova, et al., "The Influence of BF2 and F Implants on the 1/f Noise in SIGe HBTs With a Self-Aligned Link Base"; IEEE Transaction on Electron Devices, vol. 48, No. 12, Dec. 2001; pp. 2808-2815.

(Continued)

*Primary Examiner*—Phuc T. Dang
(74) *Attorney, Agent, or Firm*—Rose Alyssa Keagy; W. James Brady, III; Frederick J. Telecky, Jr.

(57) ABSTRACT

The present invention provides, in one embodiment, a method of reducing 1/f noise in a metal oxide semiconductor (MOS) device (100). The method comprises forming an oxide layer (110) on a silicon substrate (105) and depositing a polysilicon layer (115) on the oxide layer (110). The method further includes implanting a fluorine dopant (130) into the polysilicon layer (115) at an implant dose of at least about $4\times10^{14}$ atoms/cm$^2$. The polysilicon layer (115) is thermally annealed such that a portion of the fluorine dopant (130) is diffused into the oxide layer (110) to thereby reduce a 1/f noise of the MOS device (100). Other embodiments of the provide a MOS device (300) manufactured by the above-described method and a method of manufacturing an integrated circuit (500) that includes the above-described method.

19 Claims, 16 Drawing Sheets

U.S. PATENT DOCUMENTS 6,191,463 B1 * 2/2001 Mitani et al. ............... 257/411
6,403,422 B1 * 6/2002 Arita et al. ................. 438/278

OTHER PUBLICATIONS

Yael Nemirovsky; "1/f Noise in CMOS Transistors for Analog Applications"; IEEE Transactions on Electron Devices, vol. 48, No. 5, May 2001; pp. 921-927.

A. Balasinski, et al.; "Fluorinated CMOSFETS Fabricated on (100) and (111) SI Substrates"; 1993 VLSITSA; pp. 95-99.

I.C Chen, et al.; "Performance and Reliability Enhancement for CVD Tungsten Polycided CMOS Transistors Due to Fluorine Incorporation in the Gate Oxide"; IEEE Electron Device Letters, vol. 15; No. 9, Sep. 1994.

* cited by examiner

METHOD FOR MANUFACTURING A MOS TRANSISTOR HAVING REDUCED 1/F NOISE

TECHNICAL FIELD OF THE INVENTION

The present invention is directed, in general, to a method of manufacturing transistors and more specifically a method of manufacturing transistors having gate structures with reduced 1/f noise.

BACKGROUND OF THE INVENTION

Low frequency, or 1/f noise has long been a concern in the implementation of high performance analog transistor technology. It is generally accepted that 1/f noise is caused by carriers, such as electrons or holes, being transiently trapped in the gate dielectric or the interface between the gate dielectric and the channel of a transistor. The random translocation of carriers into traps or defect centers, such as silicon dangling bonds, into the gate dielectric and back into the channel, causes the current through the transistor to fluctuate, which manifests as 1/f noise.

The push toward smaller and faster semiconductor devices has increased the need to reduce 1/f noise. As an example, it is well known that the output noise spectrum ($S_{ids}$) of 1/f noise from a transistor device increases as an inverse second order function of decreasing effective channel length (i.e., $S_{ids} \propto 1/L_{eff}^2$). The increase in 1/f as device area is decreased has especially deleterious consequences for analog-to-digital converter and amplifier applications.

The effect of 1/f noise can be partially mitigated by using transistors having large device areas in the initial stages so that 1/f noise does not get amplified to the same extent as the signal in subsequent stages of an amplification circuit. This approach, however, does not prevent 1/f noise from being introduced at later amplification stages in the circuit where smaller transistors are used. Moreover, the dimensions to which such devices can be scaled down to are limited by the necessity for one or more large early stage transistors.

Accordingly, what is needed in the art is a method of making transistor devices having reduced 1/f noise that can be inexpensively incorporated into very large scale integration systems (VLSI) that do not exhibit the limitations of the prior art.

SUMMARY OF THE INVENTION

To address the above-discussed deficiencies of the prior art, one embodiment of the present invention provides a method of reducing 1/f noise in a metal oxide semiconductor (MOS) device. The method, comprises forming an oxide layer on a silicon substrate and depositing a polysilicon layer on the oxide layer. A fluorine dopant is implanted into the polysilicon layer at an implant dose of at least about $4 \times 10^{14}$ atoms/cm$^2$. The polysilicon layer is thermally annealed such that a portion of the fluorine dopant is diffused into the oxide layer to thereby reduce 1/f noise of the MOS device.

In another embodiment, the present invention provides a MOS device made by the above described process.

Still another embodiment is a method of manufacturing an integrated circuit by manufacturing a MOS device by the above described process and interconnecting the MOS device with interconnects to form an operative integrated circuit.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1A:
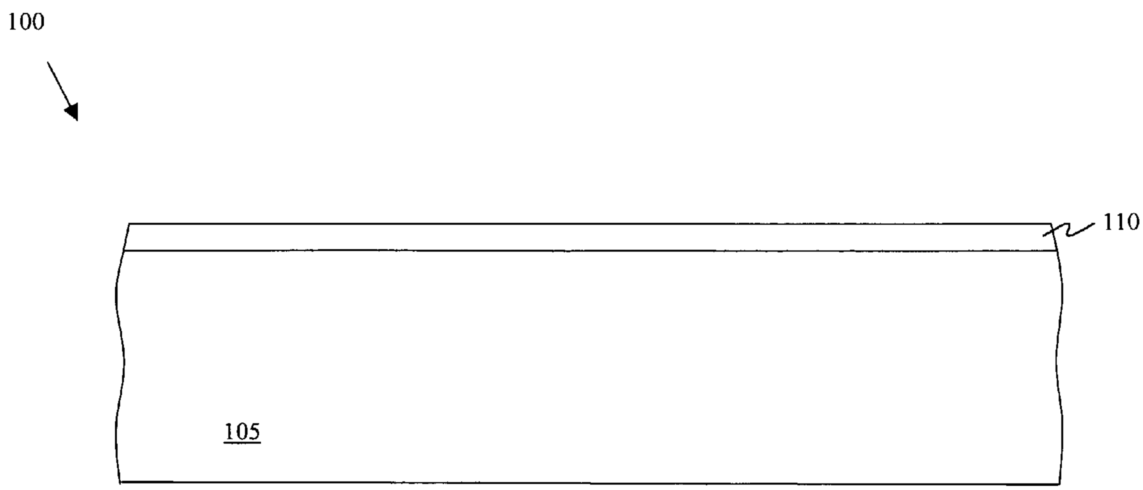
FIGS. 1A to 1F illustrate sectional views of selected steps in an exemplary method of making a MOS device according to the principles of the present invention.

The present invention benefited from studying unsuccessful attempts to scale down the size of complementary metal oxide semiconductor (CMOS) devices in high performance analog integrated circuits (ICs). The CMOS devices in the analog ICs of interest had transistors that operated at 5 Volts and effective channel lengths ($L_{eff}$) of 0.5 microns. These transistors also had stacked tungsten silicide/polysilicon gates, manufactured by a process that included the use of chemical vapor deposition (CVD) of tungsten hexafluoride ($WF_6$) and other gases on polysilicon, followed by etching to define the gate structure. CVD tungsten polycide was initially used because the sputtered tungsten polycide films had too many contaminants in them that lowered the yield and reliability.

It is desirable to manufacture smaller CMOS devices, that would operate at 3.3 Volts and have a $L_{eff}$ of 0.35 microns, with correspondingly smaller gate dimensions. Difficulties in the use of etching technology to define smaller tungsten silicide gate size, however, prompted a change in the process used to form the gate structure. The stress in the tungsten silicide was too great with narrow lines, and the tungsten silicide would crack. At the same time, new methods of sputtering tungsten silicide without the contaminants (and without the fluorine in $WF_6$) were developed. Instead of performing CVD of $WF_6$ and etching, a physical vapor deposition (PVD) technique, sputtering, was adopted, using tungsten silicide ($WSi_x$) as the target, or co-sputtered tungsten and silicon targets. Surprisingly, the resulting transistors had poor analogous circuit performance characteristics, primarily due to high levels of 1/f noise.

This unexpected failure lead to the realization that the poor performance characteristics of these CMOS transistors was due to the absence of fluorine in the gate structure. It was hypothesized that during subsequent thermal annealing steps in the previous art the transistor fabrication process involving CVD of $WF_6$, fluorine migrated from the gate structure into the silicon oxide gate dielectric. It was further hypothesized that the presence of fluorine reduced the number of traps in the gate dielectric that carriers can translocate to. Consequently, 1/f noise is reduced in CMOS transistors having fluorine-doped gate dielectrics.

Because it has not previously been recognized that fluorine doping in a gate dielectric of a CMOS device can reduce 1/f noise, the conditions to achieve such doping constitutes a new class of result-effect variables. Extensive experimental testing was necessary to find the proper combinations of fluorine dopant type and dose, implant energy, and anneal temperature to test, and ultimately affirm, the above hypotheses. This, in turn, resulted in new manufacturing processes for obtaining CMOS devices comprising either p-type channel Metal Oxide Semiconductor (PMOS) and n-type channel Metal Oxide Semiconductor (NMOS) field effect transistors with reduced 1/f noise.

FIGS. 1A to 1F illustrate sectional views of selected steps in an exemplary method of making a MOS device 100 according to the principles of the present invention. Turning first to FIG. 1A, illustrated is a silicon substrate 105 after forming an oxide layer 110 thereon. The oxide layer 105 can be formed by any convention technique such as thermally growing silicon oxide on the silicon substrate 105.

Figure 1B:
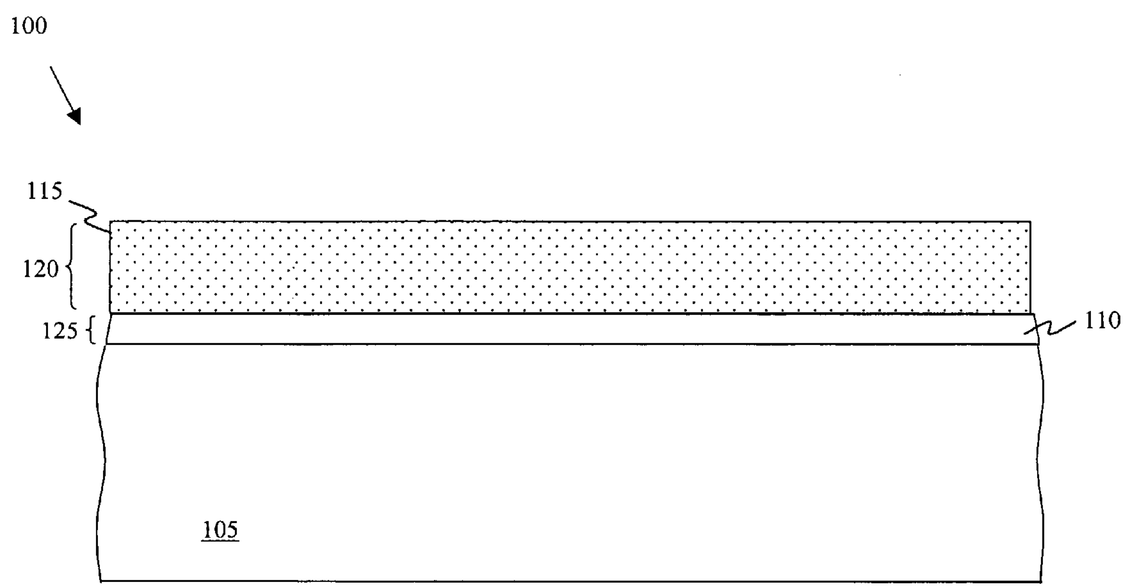

Turning now to FIG. 1B, shown is the MOS device 100 after depositing a polysilicon layer 115 on the oxide layer 110. The polysilicon layer 115 can be formed by conventional procedures, such as low pressure chemical vapor deposition, LPCVD. It is desirable to prevent fluorine from being implanted directly into the oxide layer 110 and thereby damaging oxide layer's crystal structure. In certain preferred embodiments, therefore, the polysilicon layer 115 has a minimum thickness 120 of at least about 1500 Angstroms. Typical thicknesses of the polysilicon 120 and oxide layer 125 range from about 1500 to about 3800 Angstroms and about 10 to about 400 Angstroms, respectively. Of course, one skilled in the art would understand that these thicknesses, 120, 125 and the use of shallow implant energies, further discussed below, can be cooperatively adjusted to ensure that fluorine is implanted only into the polysilicon layer 115.

Figure 1C:
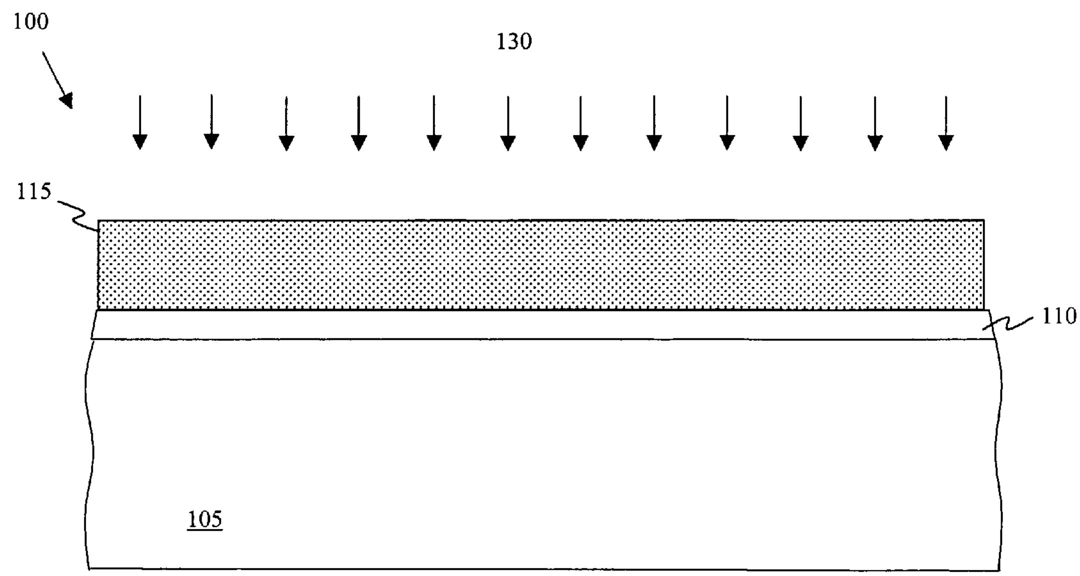

FIG. 1C illustrates the partially completed device 100 while implanting a fluorine dopant 130, represented by arrows, into the polysilicon layer 115. Preferred dopants are fluorine or boron fluorides, such as boron difluoride ($BF_2$+), boron trifluoride, or mixtures thereof. As noted above, it is desirable to implant the fluorine dopant 130 at an appropriate dose and energy so as to not be directly implanted into the oxide layer 110. A preferred fluorine dose is at least about $4\times10^{14}$ atoms/cm$^2$, although doses in the range of about $4\times10^{14}$ and about $5\times10^{15}$ atoms/cm$^2$ are also advantageous. Preferably, an acceleration energy of between about 10 and about 100 keV is used, depending on implant species, although other energies can be used.

Figure 1D:
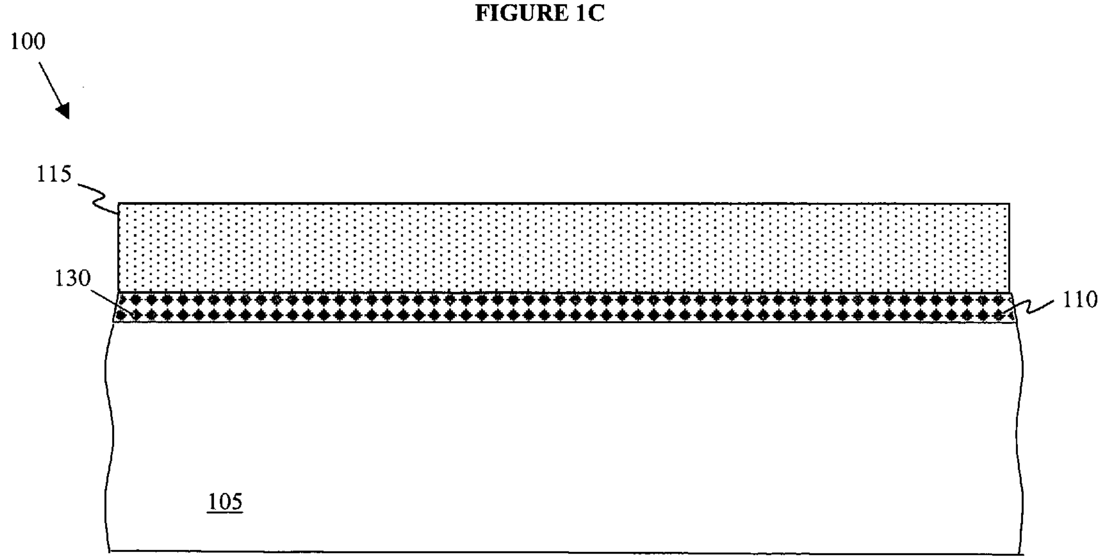

Referring now to FIG. 1D, illustrated is the device 100 after thermally annealing the polysilicon layer 115 such that a portion of the fluorine dopant, represented by diamonds 130, is diffused into the oxide layer 110. The thermal anneal is configured to ensure that the concentratin of fluorine in the oxide layer 110 is sufficient to passivate positive traps at the interface between the substrate 105 and the oxide layer 110 (e.g., in some embodiments about $1\times10^{10}$ traps/cm$^2$). As an example, in some embodiments, thermally annealing includes maintaining the polysilicon layer 115 at a temperature of between about 800 and about 950° C. for between about 10 and about 60 minutes. In some preferred embodiments, thermally annealing comprises a temperature of about 900° C. for about 30 minutes.

Figure 1E:
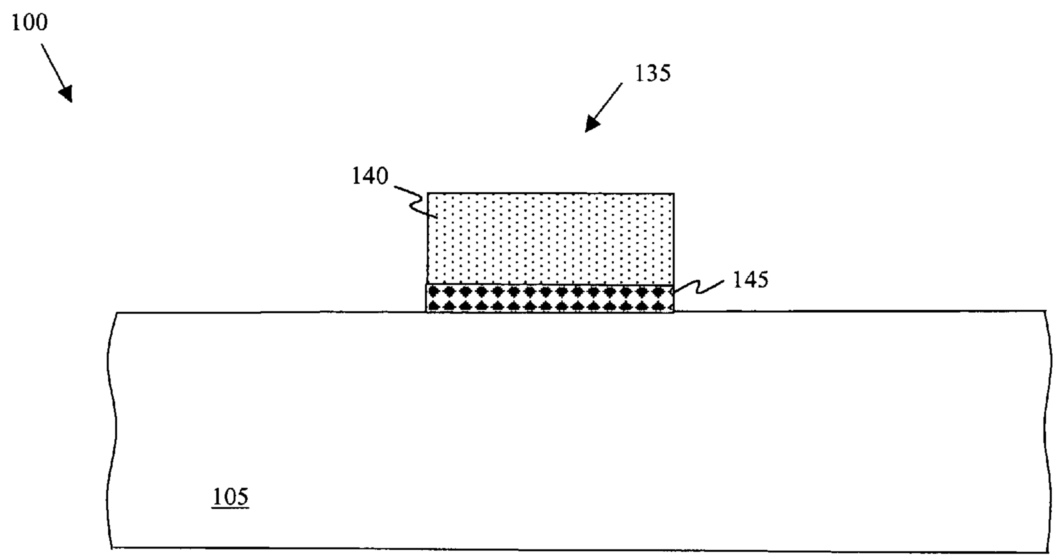

Turning now to FIG. 1E, illustrated is the partially completed MOS device 100 after performing conventional lithography and patterning procedures to form a gate structure 135 comprising a gate electrode 140 and gate dielectric layer 145 made of remaining portions of the oxide and polysilicon layers, 110, 115, respectively, shown in FIG. 1D. As well known by those skilled in the art, lithographic processes are used to fabricate semiconductor devices such as integrated circuit devices, by defining and developing a pattern in an energy sensitive material. The pattern is then used as an etch mask to transfer the pattern into one or more layers of material such as the oxide and polysilicon layers, 110, 115, shown in FIG. 1D. As explained previously, and illustrated in the example section below, the presence of fluorine in the gate dielectric layer 145 (FIG. 1E) reduces 1/f noise in the MOS device 100.

It is desirable to dope the polysilicon layer 115 shown in FIG. 1D so as to tailor the work function of the gate structure 135 shown in FIG. 1E for particular types of transistors of the CMOS device 100. In particular, it is desirable to adjust the work function of the gate structure 135 to be close to either the conduction band or the valence band of silicon in the substrate 105, because this reduces the threshold voltage ($V_T$) of the transistor, thereby facilitating a higher drive current. In some embodiments, it is therefore advantageous for the fluorine dopant 130 to include boron fluoride. Boron fluoride can comprise the boron difluoride ion ($BF_2$+), or boron trifluoride ($BF_3$) gas, or mixtures thereof. A p-type dopant such as boron is desirable because this can decrease the magnitude of the threshold voltage ($V_T$) of a PMOS transistor, and increase the threshold voltage of an NMOS transistor. For instance, implanting boron into the gate electrode can advantageously change $V_T$ from −1.3 V to −0.8 V for a PMOS transistor, and from +0.4 V to +0.7 V for an NMOS transistor.

Additional dopants can also be implanted into the gate electrode 140 to further adjust its work function. As an example, implanting fluorine can also include an n-type dopant such as phosphorus (P). Of course, the additional dopants can be implanted before or after, as well as concurrent with the implantation of fluorine.

Figure 1F:
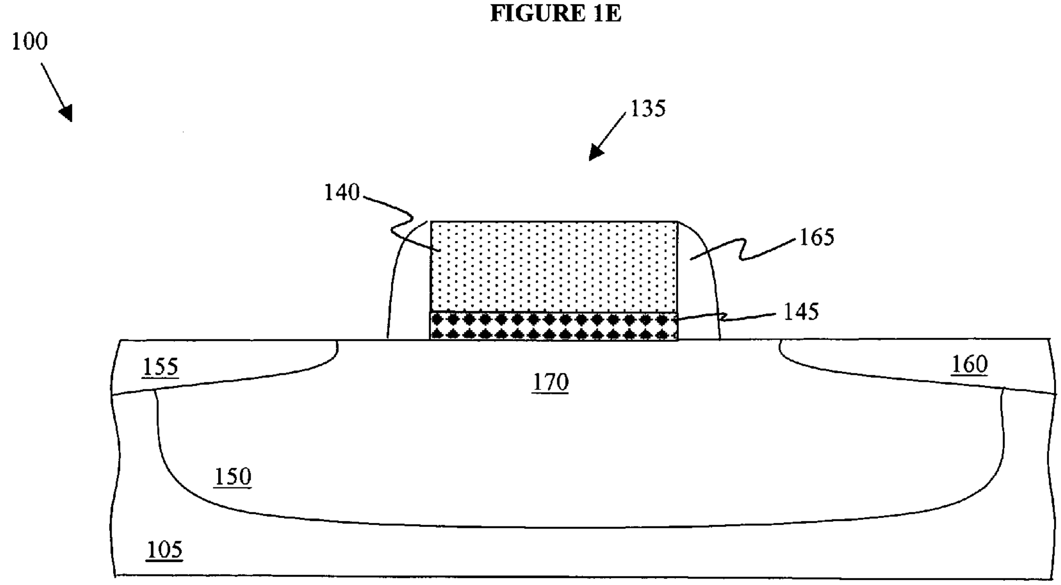

As illustrated in FIG. 1F, additional conventional procedures can be performed to form other device components, including a doped tub 150, source and drain electrodes, 155, 160, side wall structures 165, and channel region 170, to provide an operative device 100. As well understood by those skilled in the art, some of these components can be advantageously formed before or concurrent with the steps illustrated in FIGS. 1A–1E, while other components can be formed afterwards.

One skilled in the art would also appreciate that multiple advantageous modifications in the above described exemplary method can be made, and additional device integration steps added, while still being within the scope of the present invention.

Figure 2A:
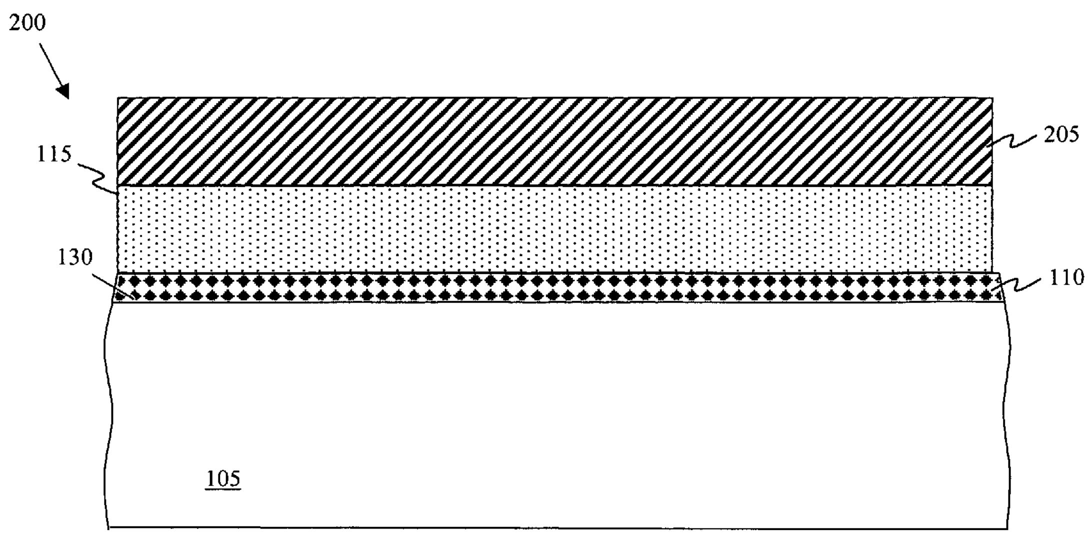
FIGS. 2A–2E illustrate sectional views of selected steps in a modification in the exemplary method of manufacturing a MOS device according to the principles of the present invention.

By way of example, FIGS. 2A–2D illustrate a modification in the above-described method of manufacturing a MOS device 200, where the gate further includes a metal or silicide. For instance, as illustrated in FIG. 2A, after annealing to diffuse fluorine 130 into the oxide layer 110, as shown in FIG. 1D, a metal layer 205 can be deposited on the polysilicon layer 115. In some preferred embodiments, the metal layer 205, comprising tungsten silicide ($WSi_x$, where e.g., x=~2.0 to ~2.6) is deposited using a PVD process, such as sputtering. Of course, other PVD processes can be used to deposit any number of metals and metal compounds, including Cu, Al, Ta, $WSi_x$, TiN, Ti, Co, Ni, and W, or combinations thereof. For instance, the deposition of W-containing metal layer 205 via evaporation, electron-beam evaporation, and plasma spray deposition, are also within the scope of the present invention.

Figure 2B:
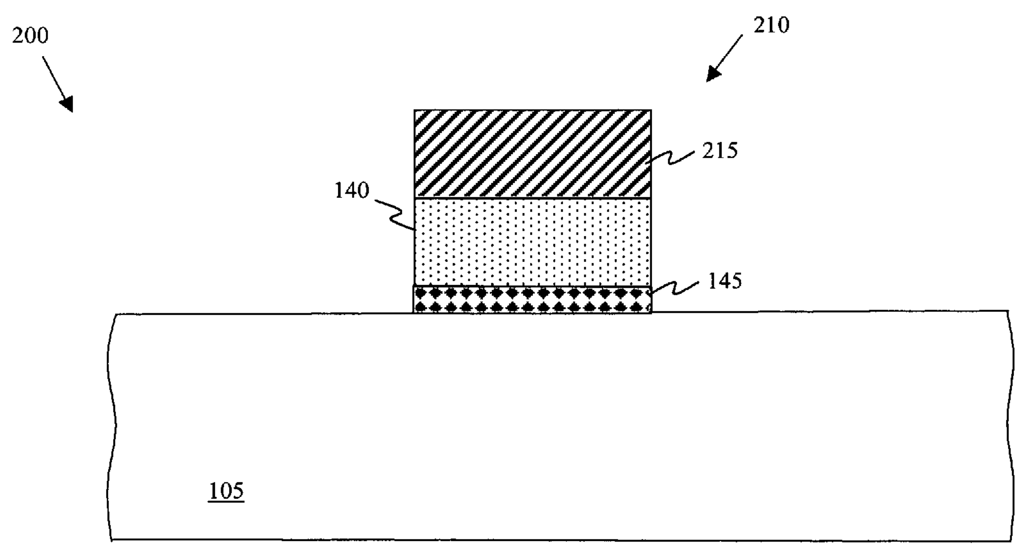

Turning now to FIG. 2B, illustrated is the partially completed MOS device 200 after performing conventional lithography and patterning procedures substantially the same as described above, to form a gate structure 210 having a metal gate electrode 215 on the polysilicon gate electrode 140. As well understood by those skilled in the art, stacked metal-on-polysilicon gate structures 210 are advantageous because they have the low sheet resistance of the silicide with the polysilicon underneath forming a good interface of silicon dioxide and polysilicon.

Figure 2C:
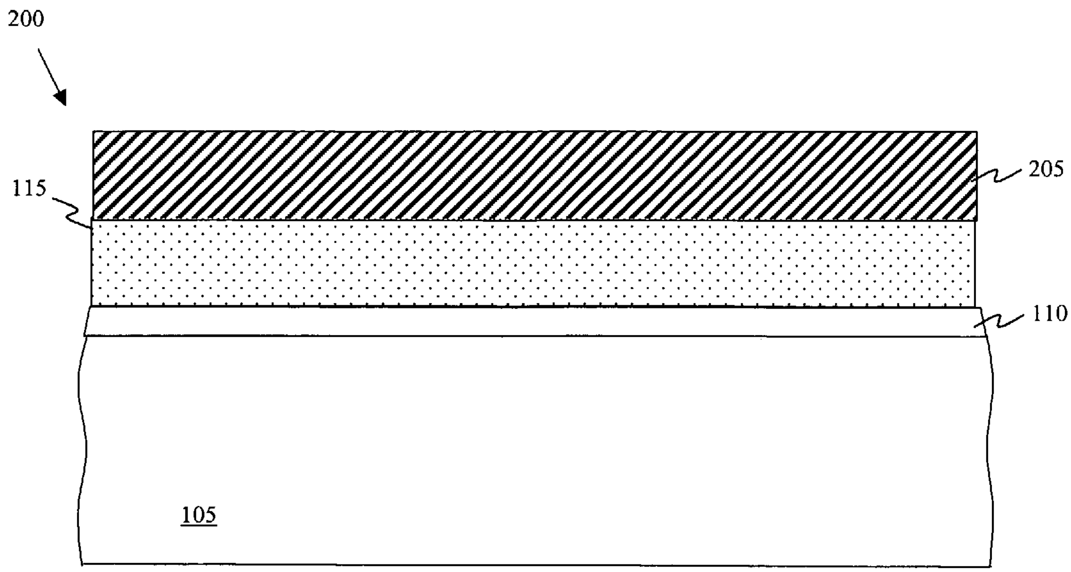
Figure 2D:
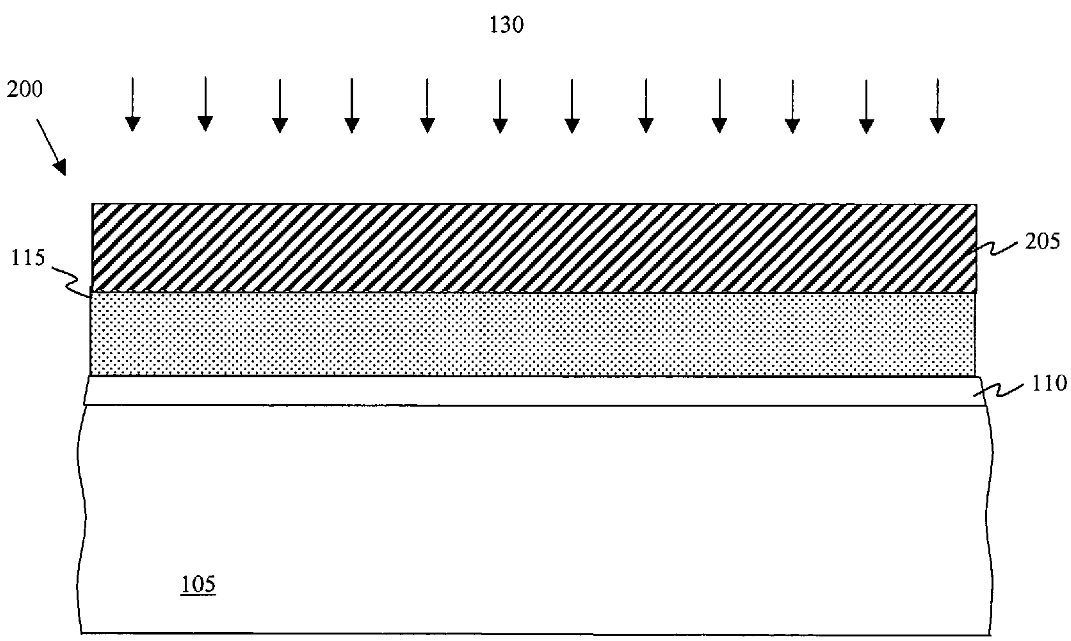
Figure 2E:
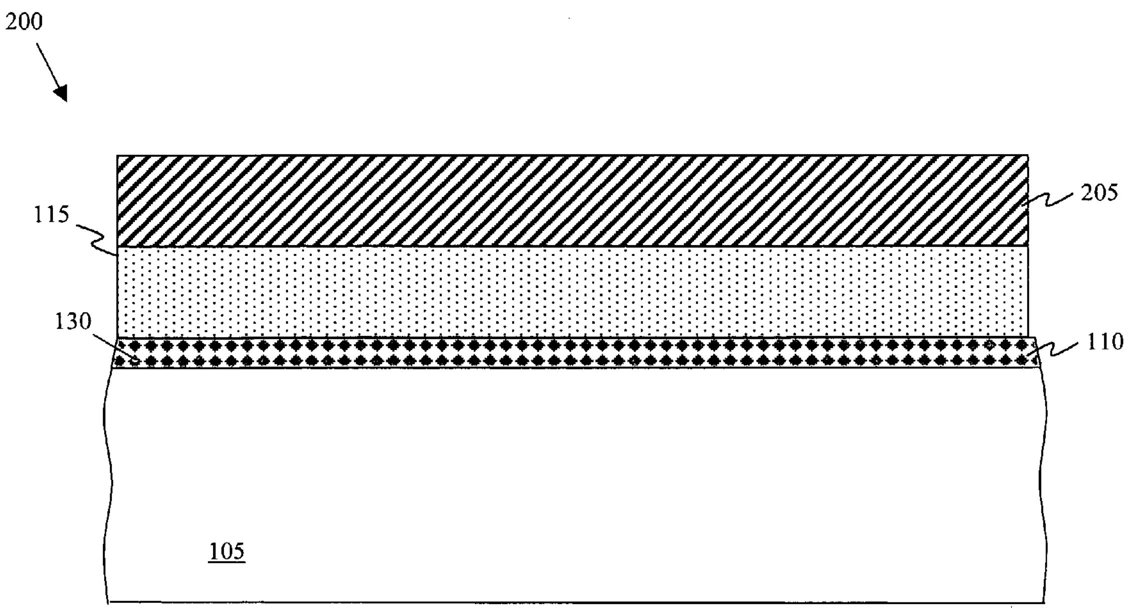

FIGS. 2C–2E present an alternative method to the process illustrated in FIGS. 2A–2B. As shown in FIG. 2C, after depositing the polysilicon layer 115, such as illustrated in FIG. 1B, the metal layer 205 can be deposited as described above. This is followed by fluorine implantation 130 as shown in FIG. 2D and thermal annealing to diffuse fluorine 130 into the oxide layer 110, as illustrated in FIG. 2E. Conventional lithography and patterning procedures can then be performed substantially the same as described above, to form a gate structure 210 having a metal gate electrode 215 on the polysilicon gate electrode 140, substantially the same as shown in FIG. 2B. Of course, additional conventional processing steps can be performed in conjunction with the processing steps shown in FIGS. 2A–2B or 2C–2E, to form an operative device 200.

Yet another modification of the method is illustrated in FIGS. 3A–3D, where the work function of gates are individually adjusted. As well known by those skilled in the art, numerous conventional procedures can be used to form dual work function gates in CMOS devices having p-type channel metal oxide semiconductor (PMOS) transistors and n-type channel metal oxide semiconductor (NMOS) transistors.

Figure 3A:
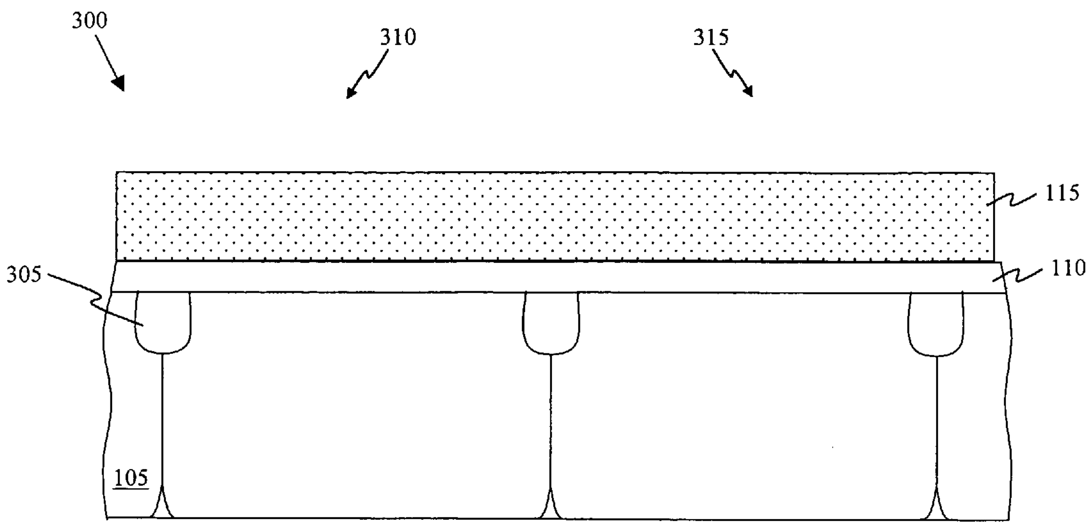
FIGS. 3A–3E illustrate sectional views of selected steps in yet another modification in the exemplary method of manufacturing a MOS device according to the principles of the present invention.

Turning first to FIG. 3A, illustrated is a partially completed CMOS device 300 after forming an oxide layer 110 on a silicon substrate 105, and depositing a polysilicon layer 115 on the oxide layer 110, using procedures substantially the same as described above. In addition, conventional procedures are followed to form one or more isolation structures 305, such as a shallow trench isolation structure, between the regions of substrate 105 designed to be the PMOS and NMOS transistors 310, 315. As noted above, implanting a fluorine dopant containing a p-type dopant, such as boron, and other dopants, such as P, can advantageously adjust the gate work function. In certain instances, however, it is desirable to separately adjust the gate work function of the transistors 310, 315.

Figure 3B:
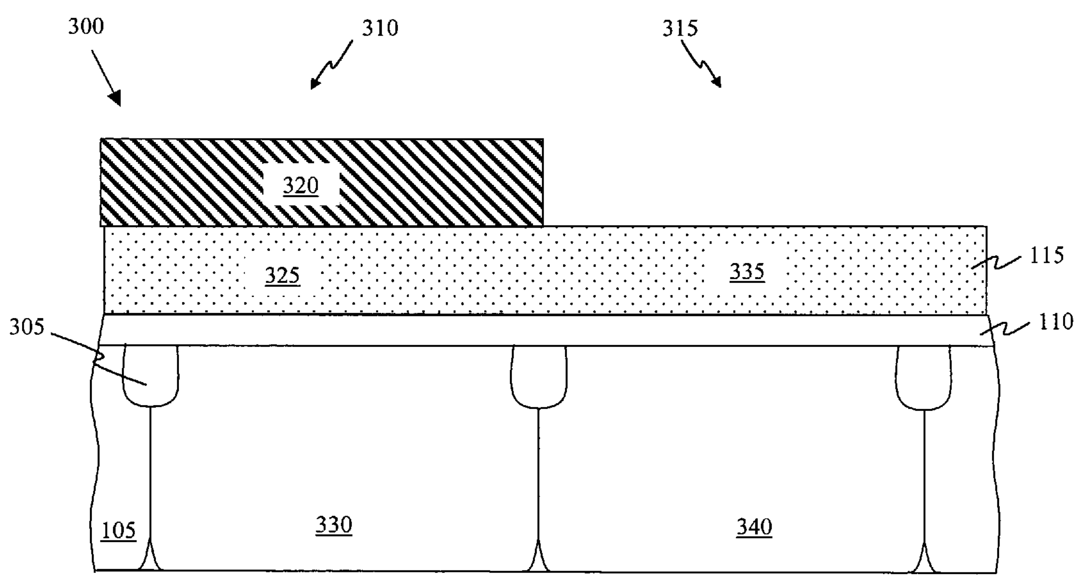
Figure 3C:
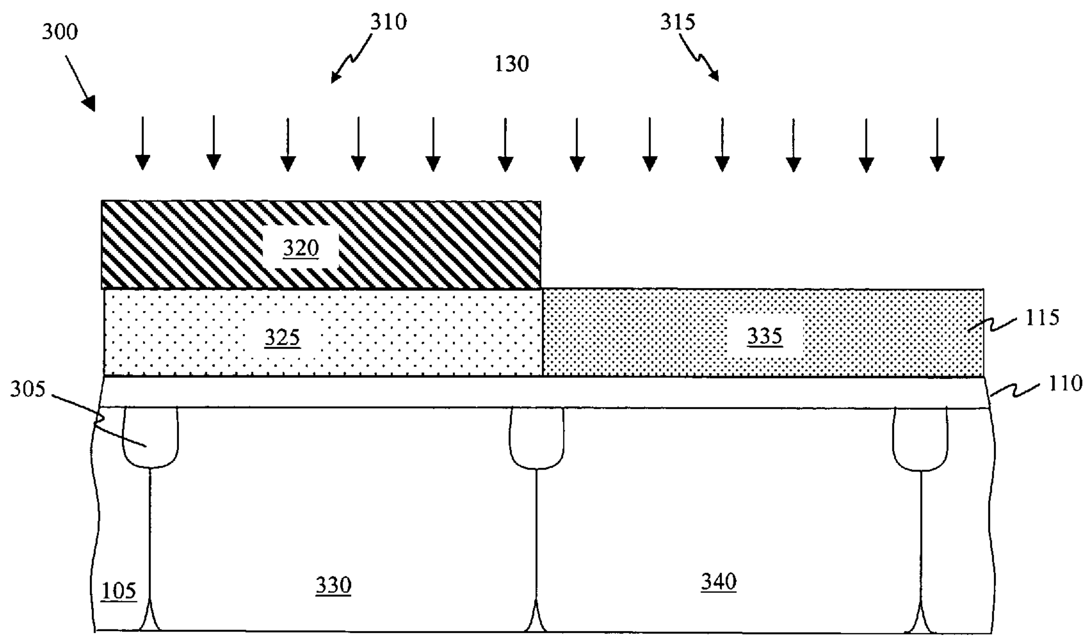

As an example, FIG. 3B illustrates forming a resist layer 320 over a portion of the polysilicon layer 325, before implanting fluorine dopant. As illustrated in FIG. 3B, the portion 325 covered by the resist layer 320 can be over the n-type substrate 330 of the PMOS transistor 310. An uncovered portion of polysilicon 335 overlays a p-type substrate 340 of the NMOS transistor 315. Covering the polysilicon layer 325 with resist 320 advantageously prevents introducing p-type dopant into the polysilicon layer 325 when implanting a fluorine dopant 130, as illustrated in FIG. 3C. For instance, introducing of boron into the polysilicon layer 325 via the above-described fluorine dopant implantation and thermally annealing procedures can undesirably shift the PMOS transistor's 310 threshold voltage. However, implanting boron into the uncovered portion of polysilicon 335, can advantageously change the gate work function of the NMOS transistor 315.

Figure 3D:
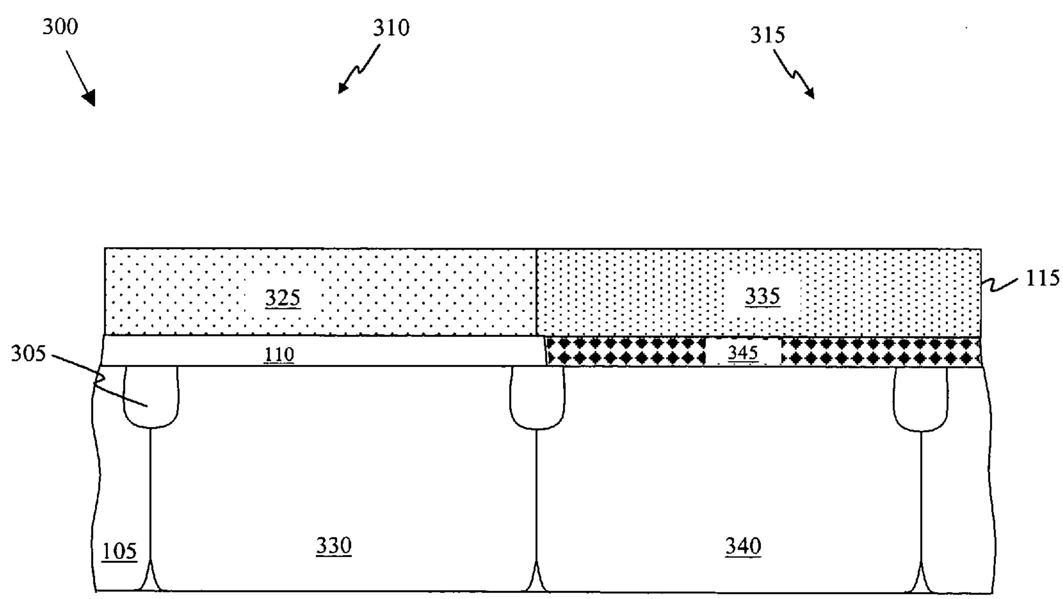
Figure 3E:
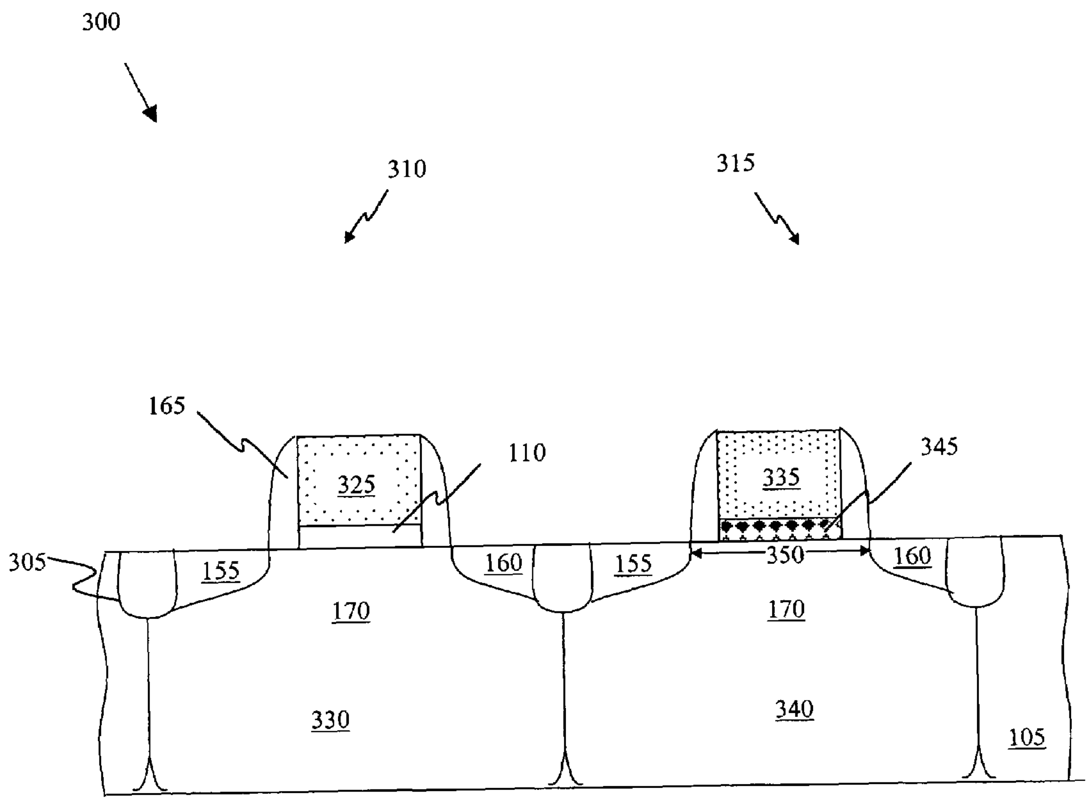

Turning now to FIG. 3D, illustrated is the partially completed CMOS device 300 after removing the resist layer 320, performing a thermal anneal to diffuse fluorine dopant into the gate oxide layer 345 of the NMOS transistor 315. Of course, analogous procedures can be performed to adjust the gate work function of the PMOS transistor 310, or to separately implant fluorine into the polysilicon layer 325 of the PMOS transistor 310. As illustrated in FIG. 3E, the device 300 can then be completed using the substantially the same processing steps as described above, to provide an operative CMOS device 300.

Still another modification of the method is illustrated in FIGS. 4A–4D, where the formation of a high sheet resistor (HSR) is included in the method. The term high sheet resistor (HSR) as used herein refers to a polysilicon layer that is suitably doped to provide a resistance of at least about 300 Ohms/square (usually between 1000 and 2000 Ohms/square). As well understood by those skilled in the art, HSRs are advantageously used to control bias currents in analog gain stages of amplifier ICs.

Figure 4A:
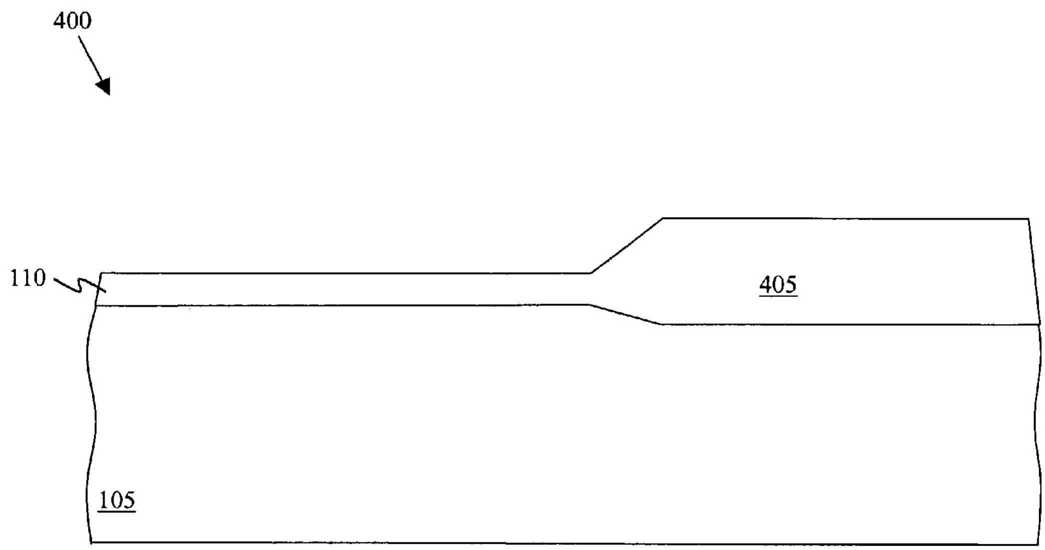
FIGS. 4A–4F illustrate sectional views of selected steps in still another modification in the exemplary method of manufacturing a MOS device according to the principles of the present invention.
Figure 4B:
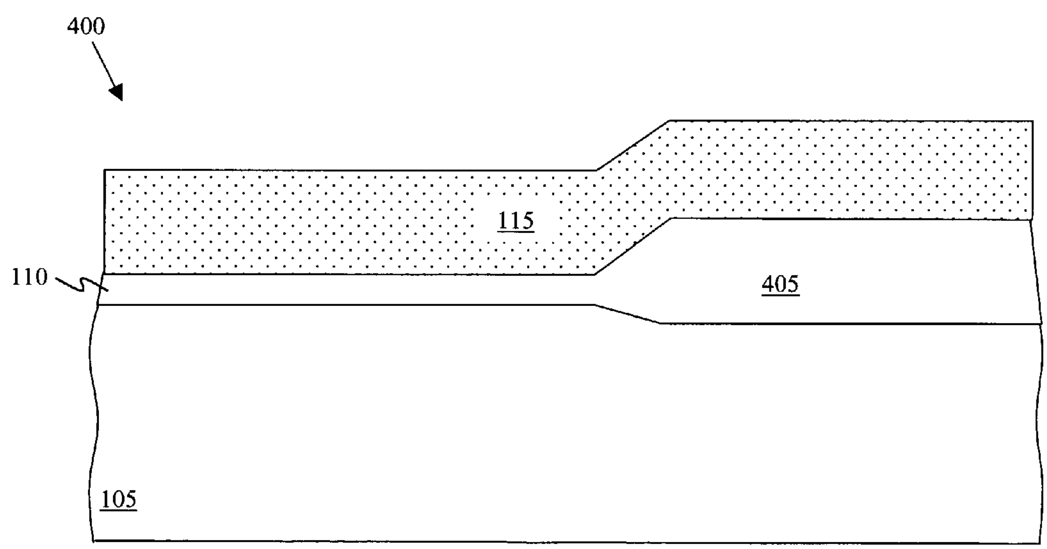
Figure 4C:
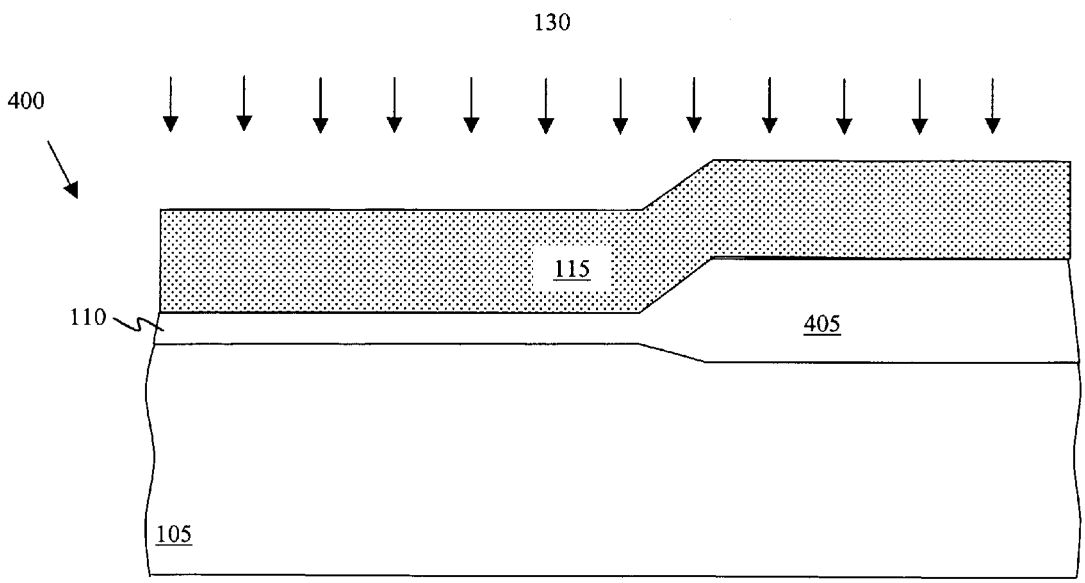

Turning first to FIG. 4A, illustrated is a portion of a partially completed MOS device 400, after forming the oxide layer 110, as described above, and forming a field oxide (FOX) region 405 in or on the silicon substrate 105. The FOX region 405 can be formed via the local oxidation using conventional techniques. As shown in FIG. 4B, the polysilicon layer 115 is then deposited, as described above, on both the oxide layer 110 and FOX region 405. Turning now to FIG. 4C, illustrated is the partially completed MOS device during the implantation of fluorine dopant 130 into the polysilicon layer 115. In some advantageous embodiments, the fluorine dopant, comprising boron fluoride, whereby fluoride reduces 1/f noise in the MOS device 400 as discussed above, and boron serves to adjust the resistance of the HSR to be formed such as described below.

Figure 4D:
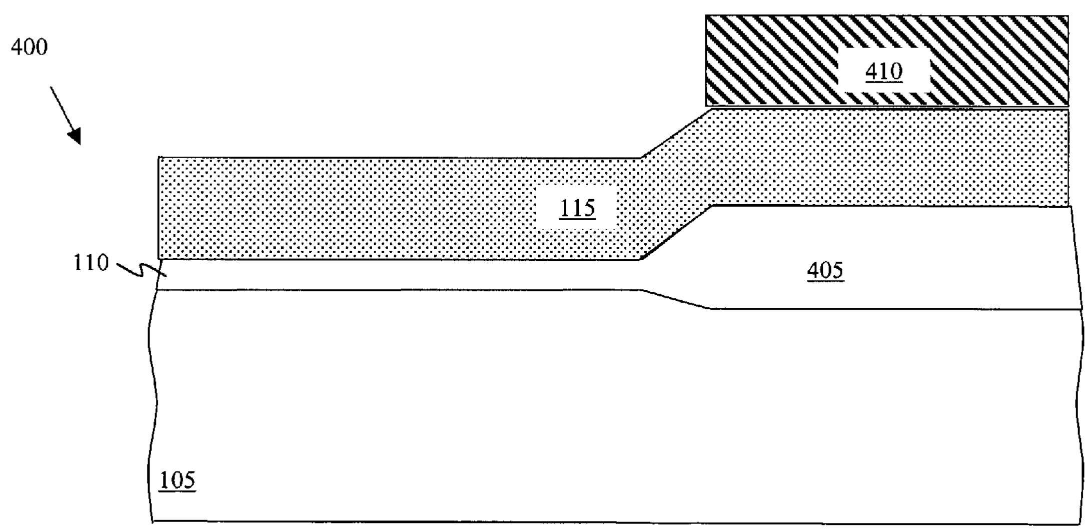
Figure 4E:
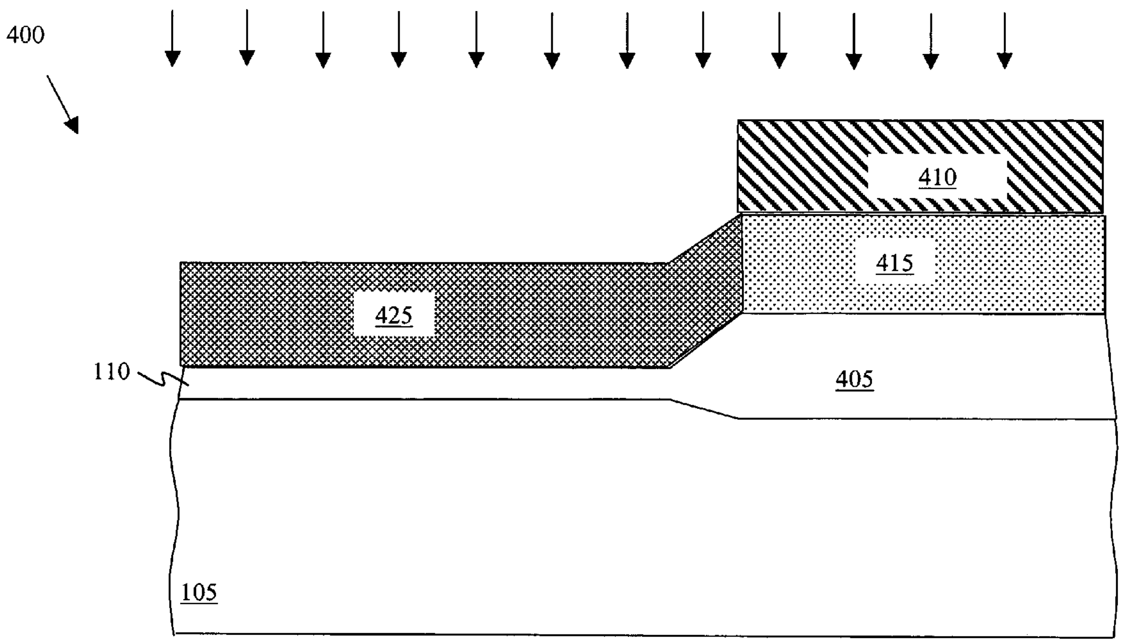
Figure 4F:
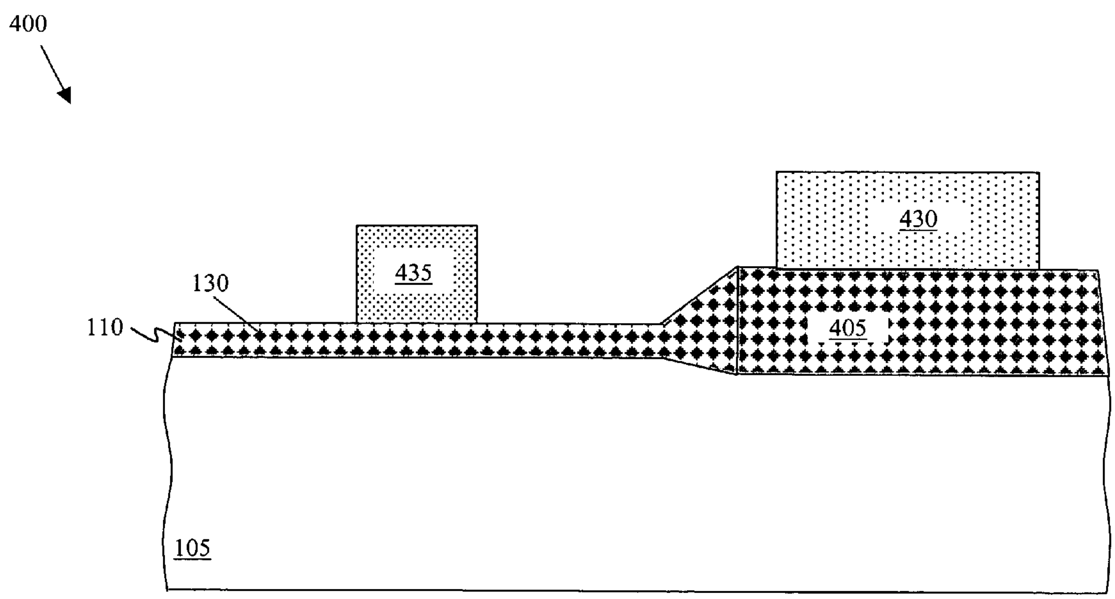

Next, as illustrated in FIG. 4D, a resist layer 410 is formed on a portion of the polysilicon layer 415 overlying the FOX region 405. Then, as illustrated in FIG. 4E, an n-type dopant 420, such as P, is implanted into a second portion of the polysilicon layer 425 not covered by the resist layer 410. Referring now to FIG. 4F, illustrated in the partially completed device after removing the resist layer 410, performing a thermal anneal to diffuse fluorine 130 into the oxide layer 110 and patterning the differently doped polysilicon layers 415, 425 to form a HSR 430 n-type gate electrode 435, respectively. Of course, the device 400 can be completed using the substantially the same conventional processing steps as described above, to provide an operative CMOS device 400.

Yet another aspect of the present invention is a MOS device made by according to any of above-described methods. A portion of one such MOS device was presented previously in FIG. 3E. Returning to FIG. 3E, in certain preferred embodiments, the MOS device 300 includes an NMOS transistor 315 having an n-type polysilicon gate 335 and fluorine-containing gate dielectric 345. As well understood by those skilled in the art, NMOS transistors 315 are particularly susceptible to 1/f noise because the electrons serve as the carrier. Electrons are highly mobile and therefore can easily move to traps in the gate dielectric 345.

In preferred embodiments the transistor 315 has a noise parameter ($K_f$) that is at least about 40 percent lower than a noise parameter for a substantially similar NMOS transistor that does not include the fluorine-containing gate dielectric 345. One skilled in the art would understand how to determine $K_f$ for such a MOS device 300, such as illustrated in the example section below. In certain embodiments of the MOS device 300, for example, $K_f$ is less than about $1.09\times10^{-28}$ at a frequency of 100 Hz. In other embodiments the MOS device is a CMOS device having an integrated noise factor (K_int) that is at least about 3 times lower, and more preferably 10 times lower, than a substantially similar CMOS device having substantial fluorine-free oxide layers A small scale MOS device 300 having such characteristics are particularly valuable because, as previously explained, 1/f noise becomes increasingly large relative to the signal transmitted through the MOS device 300. For instance, in some preferred embodiments, the MOS device 300 a CMOS device having an area of less than about 18×0.6 micron$^2$ and channel length 350 of less than about 0.5 microns, and more preferably less than about 0.35 microns.

Figure 5A:
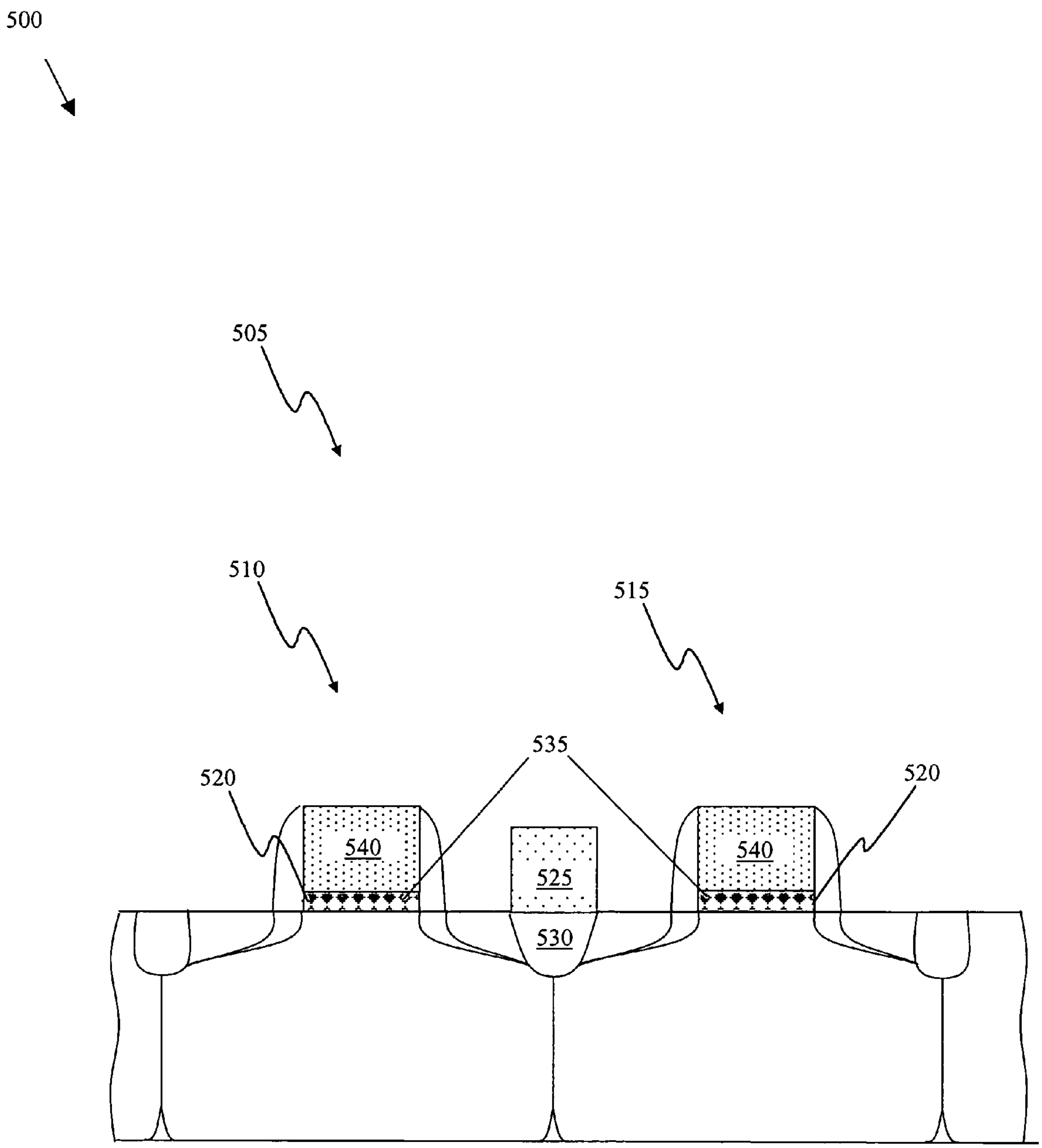
FIGS. 5A–5B illustrate sectional views of selected steps in a method of manufacturing an integrated circuit according to the principles of the present invention.
Figure 5B:
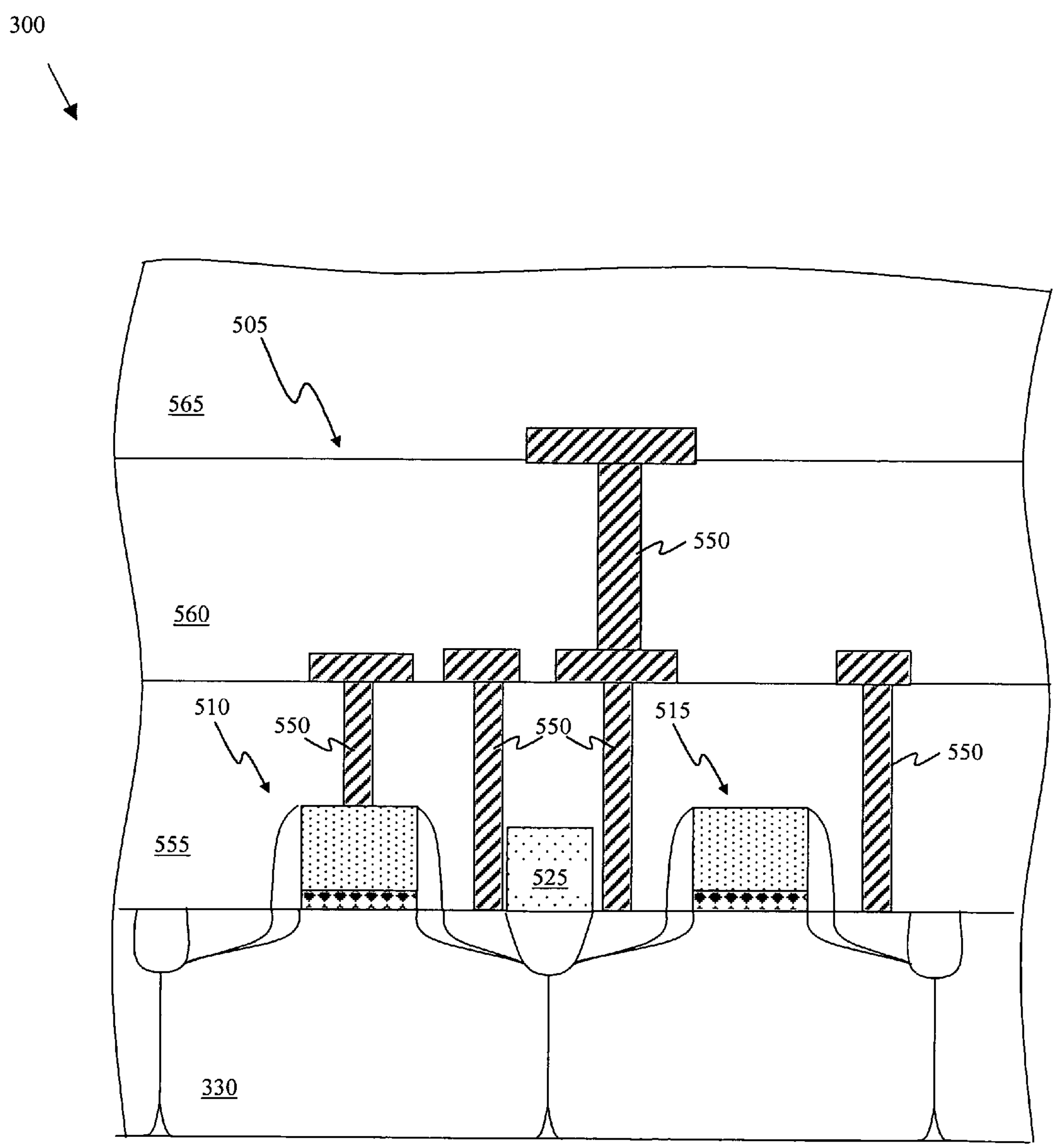

Still another aspect of the present invention, a method of making an integrated circuit 500, is illustrated in illustrated FIGS. 5A–5B. Referring now to FIG. 5A, shown is a partially completed integrated circuit 500 where a MOS device 505, such as a CMOS device, has been forming using the above-described methods to thereby reduce a 1/f noise of the MOS device 505. Any of the embodiments of the methods of manufacturing the MOS device 505, as described elsewhere herein, may be incorporated into the method of making an integrated circuit 500. In some preferred embodiments, the MOS device 505 includes one or more transistors, such as PMOS and NMOS transistors, 510, 515, each having a fluorine-containing gate dielectric 520.

As illustrated in FIG. 5A and 5B, the integrated circuit 500 can further include a high sheet resistor 525 formed on a same level as the MOS device 500 using substantially the same procedures as described previously herein. As illustrated in FIG. 5A in some preferred embodiments, the high sheet resistor is formed on a field oxide layer 530. In other advantageous embodiments, the high sheet resistor 525 includes a counter ion of the fluorine dopant 535 implanted into the polysilicon gate electrode 540 and diffused into the oxide layer 520 that is used to form the gate dielectric 545. For example, when the fluorine dopant 535 is boron difluoride, the counter ion is boron. In some such embodiments, the field oxide layer 530 is substantial free of the fluorine dopant 535.

FIG. 5B shows forming interconnect metals lines 550 in or on one or more dielectric layers 555, 560, 565 located over the MOS devices 505 to form an operative integrated circuit 500.

Having described the present invention, it is considered that the same will become even more apparent by reference to the following examples. It should be appreciated that the examples are presented solely for the purpose of illustration and should not be construed as limiting the invention. For instance, although the experiments described below may be carried out in laboratory setting, one of ordinary skill in the art could adjust specific numbers, dimensions and quantities up to appropriate values for a full scale plant.

EXAMPLES

Selected measurements comparing 1/f noise levels in fluorine-implanted versus non-fluorine-implanted transistors fabricated according to the methods of the present invention are presented to illustrate various methods and beneficial features of the invention.

In one series of experiments, NMOS transistors were manufacturing using the methods of the present invention substantially as described above. Specifically, a 0.31 micron thick polysilicon layers was deposited over a 120 Angstrom thick thermally grown silicon oxide layer. In one batch of wafers, boron difluoride was then implanted into the polysilicon at a dose of $1.2\times10^{15}$ atoms/cm$^2$ and acceleration energy of 60 KeV. In another batch of wafers, no fluorine implantation was done. Both fluorine-implanted and non-fluorine-implanted batches of wafers were then subject to identical annealing conditions (900° C. for 30 minutes) sufficient to allow fluorine to diffuse into the silicon oxide layer. The anneal was followed by patterning and etching to define a gate structure and effective channel length ($L_{eff}$) of 0.5 microns. This was followed by conventional procedures to form source/drain structures, isolation structures etc . . . , to complete the NMOS transistor. The dimensions of the completed transistors were approximately 18×0.6 micron$^2$.

Since the magnitude of the 1/f noise is a function of both the gate and drain biases, the transistors are usually measured under various bias conditions to observe such a relationship. The 1/f noise is also dependent on the device geometries, such as the device's width, length, oxide thickness, etc. There are empirical noise models to show such a relationship in publications (e.g. Nemirovsky, et al., "1/f noise in CMOS transistors for analog applications," *IEEE Trans. Electron. Devices*, vol. 48, no. 5, pp. 921–927, May 2001.) Briefly, the gate voltage noise power spectral density ($S_{vg}$) was determined over an operating frequency of about 1 to $10^5$ Hz, by measuring the current noise power spectral density ($S_{id}$) and dividing $S_{id}$ by the square of the transconductance gm (i.e., $S_{vg}=S_{id}/g_m^2$) Sid is the current fluctuation measured at the drain terminal, while the transconductance is d(Id)/d(Vgs) near the bias point. The integrated $S_{id}$ was normalized for transistor-to-transistor variations in effective channel length and gate oxide capacitance ($L_{eff}$ and $C_{ox}$, respectively).

Figure 6:
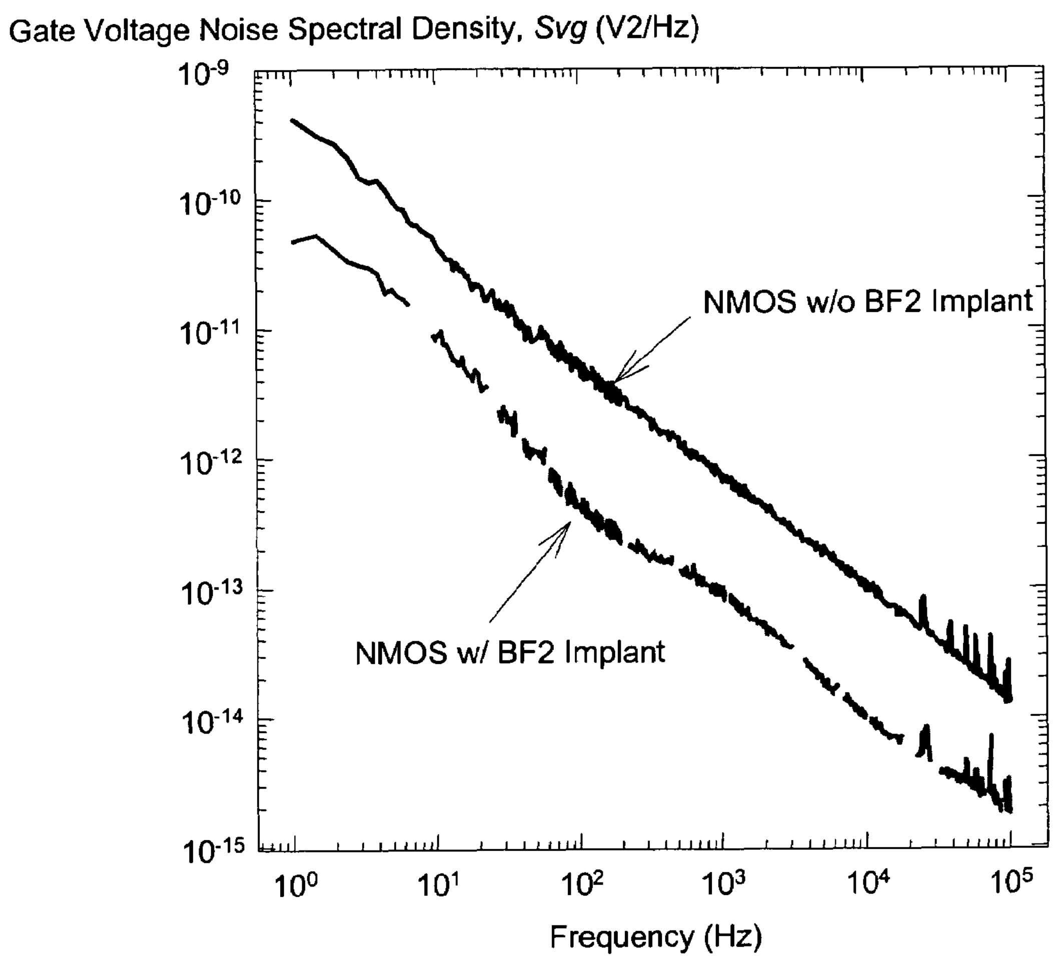
FIG. 6 shows exemplary plots comparing $S_{vg}$ as a function of operating frequency for fluorine-implanted NMOS transistors manufactured according to the principles of the present invention to non-fluorine-implanted NMOS transistors.

FIG. 6 shows exemplary plots of $S_{vg}$ as a function of operating frequency for fluorine-implanted ("NMOS w/BF2 implant") and non-fluorine-implanted ("NMOS w/o BF2 implant") NMOS transistors. Each transistor was biased with substantially the same source/drain voltage ($V_{ds}$~5 Volts) and current ($I_{ds}$~$6.25\times10^{-4}$ A). Each plot represents the average results for 11 different wafer dies used to make fluorine-implanted and non-fluorine-implanted NMOS transistor. The figure shows that, over a broad range of operating frequencies, NMOS transistors having fluorine in the silicon oxide layer have $S_{vg}$ values that are about an order of magnitude lower than non-fluorine-containing NMOS transistors.

In a second series of experiments, NMOS transistors were fabricated in substantially the manner as described above with the exception that different doses of boron difluoride were implanted into polysilicon at an acceleration energy of 60 KeV. In addition, the dimensions of the completed transistors were approximately 20×0.6 micron$^2$. The noise characteristics of the resulting transistors were examined similar to that described above, with the exception that a noise parameter, $K_f$ was determined according to the following empirical model: $K_f=(S_{id}\cdot f\cdot C_{ox}\cdot L_{eff}^2)/I_{ds}^{AF}$, AF is a noise factor, f is operating frequency, and $I_{ds}$, $C_{ox}$ and $L_{eff}$ are as defined above. The noise factor AF depends on the size of $I_{ds}$, but for typical MOS transistors equals unity. The noise parameter Kf is typically used as the figure of merit, since it is proportional to the quality of the gate oxide, with the device geometry and bias conditions normalized. Thus, it is the parameter frequently used for comparing noise performance.

TABLE 1 presents exemplary $K_f$ values obtained for NMOS transistors (at f=100 Hz) formed using various implantation doses of boron difluoride. The results are presented as an average and standard deviation (±SD) of several transistors at each of four dose levels. These results illustrate that implantation doses of boron difluoride of at least about $4\times10^{14}$ atoms/cm$^2$ result in an at least about 40 percent reduction in $K_f$.

TABLE 1

| Lot | Number Transistors | of $BF_2$ dose (atoms/cm$^2$) | Average $K_f$ ± SD × $10^{-29}$ (Amp-Farad) |
|---|---|---|---|
| 1 | 8 | 0.0 | 18.50 ± 3.60 |
| 2 | 6 | $0.40\times10^{15}$ | 10.90 ± 4.07 |
| 3 | 3 | $1.00\times10^{15}$ | 4.86 ± 1.94 |
| 4 | 5 | $2.00\times10^{15}$ | 3.04 ± 1.66 |

In third series of experiments, NMOS transistors were fabricated in substantially the manner as described above with the exceptions that two different anneal temperatures (~800° C. and ~900° C. for ~30 minutes) were performed after implanting boron difluoride at a dose of about 1.2e15 atoms/cm2 and acceleration energy of about 60 KeV. The dimensions of the completed transistors were approximately 18×0.6 micron$^2$. The transistors were tested using a $V_{ds}$ of about 5 Volts and a range of $I_{ds}$ ($1\times10^{-4}$ to $4.6\times10^{-3}$ A). An integrated noise parameter (Int_$K_f$) was determined by integrating $S_{id}$ over discrete ranges of frequencies (e.g., $\Sigma(S_{id}\cdot\Delta f)$ for f=10 to 1000 Hz) using the following equation: Int_$K_f=(\Sigma(S_{id}\ \Delta f)\cdot L_{eff}^2\cdot C_{ox})/I_{ds}$. To facilitate transistor-to-transistor comparisons, a normalized drain current ($L_{eff}/W_{eff}\cdot I_{ds}$) was calculated, where $W_{eff}$ is 17.8 micron.

Figure 7:
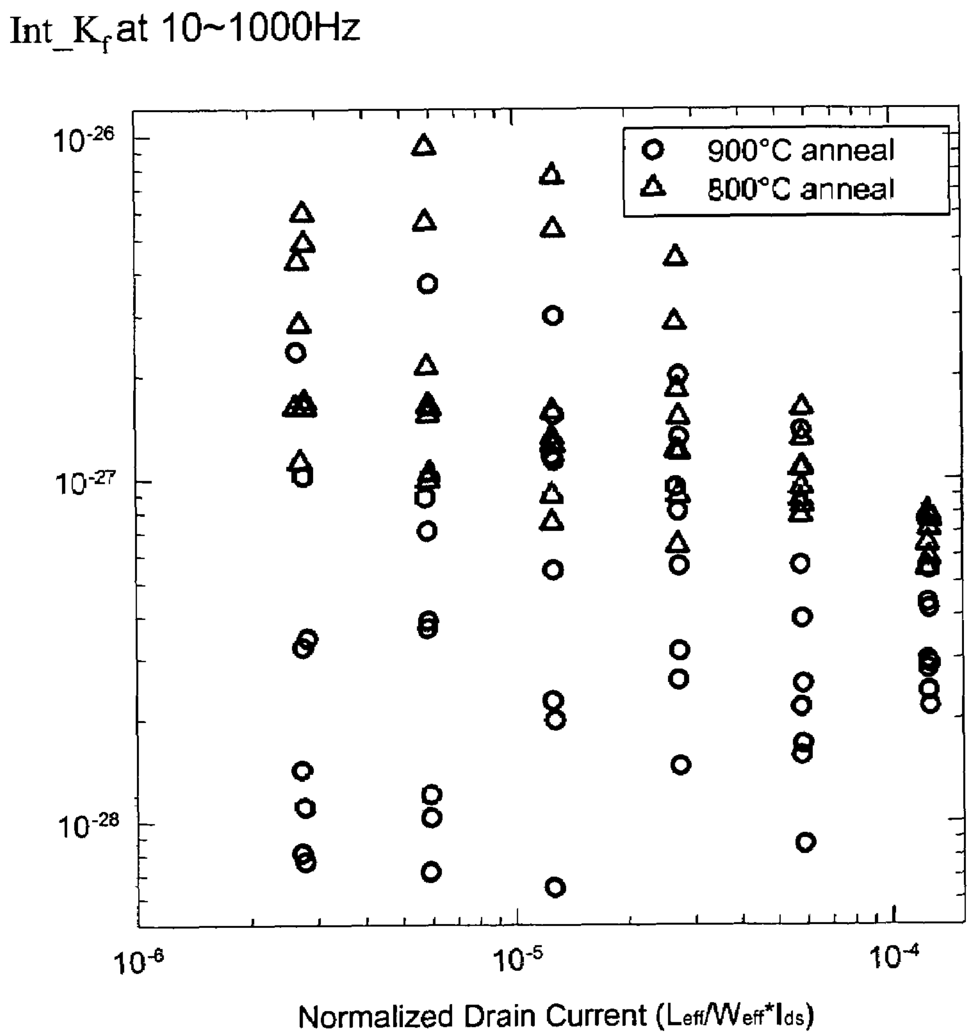
FIG. 7 shows exemplary plots of Int_$K_f$ as a function of normalized drain current for NMOS devices manufactured according to the principles of the present invention.

FIG. 7 shows exemplary plots of Int_Kf as a function of normalized drain current for NMOS transistors manufactured using an anneal temperature of 900° C. ("900° C. anneal" or 800° C. ("800° C. anneal"). The results illustrate that the anneal temperature is an important determinant of 1/f noise. For instance, transistors fabricated using a 900° C. anneal had an Int_Kf that was between 3 to 10 times lower than Int_$K_f$ for transistors fabricated using an 800° C. anneal, depending on the bias conditions reflected by the normalized drain current and $V_{ds}$. This follows because the anneal temperature controls the depth and the rate of F diffusion into the gate dielectric layer. This illustrated that to lower device noise, very specific combinations of fluorine dosage, implant energy, and anneal temperature to diffuse the fluorine dopants to the gate oxide are required.

Although the present invention has been described in detail, one of ordinary skill in the art should understand that they can make various changes, substitutions and alterations herein without departing from the scope of the invention.

What is claimed is:

1. A method of reducing 1/f noise in a metal oxide semiconductor (MOS) device, comprising:

forming an oxide layer on a silicon substrate;

depositing a polysilicon layer on said oxide layer;

implanting a fluorine dopant into said polysilicon layer at an implant dose of at least about $4\times10^{14}$ atoms/cm$^2$; and thermally annealing said polysilicon layer such that a portion of said fluorine dopant is diffused into said oxide layer to thereby reduce a 1/f noise of said MOS device, said thermally annealing step including maintaining said polysilicon layer at a temperature of between 850° C. and 950° C. for between about 10 and about 60 minutes.

2. The method as recited in claim 1, wherein said fluorine dopant is selected from the group consisting of boron fluoride and fluorine.

3. The method as recited in claim 1, wherein implanting includes a dose of said fluorine dopant of between about $4\times10^{14}$ and about $2\times10^{15}$ atoms /cm$^2$ and an acceleration energy of between about 30 and about 120 keV.

4. The method as recited in claim 1, further including sputter depositing a tungsten-silicide ($WSi_x$) layer on said polysilicon layer after said implanting.

5. The method as recited in claim 1, further including sputter depositing a tungsten-silicide ($WSi_x$) layer on said polysilicon layer before said implanting.

6. The method as recited in claim 1, further includes forming a resist layer over a portion of said polysilicon layer before said implanting said fluorine dopant.

7. The method as recited in claim 6, further includes:

forming a field oxide over said substrate before depositing said polysilicon layer and forming a resist layer over said a portion of said polysilicon over said field oxide before implanting said n-type dopant.

8. The method as recited in claim 1, wherein said implanting further includes implanting an n-type dopant.

9. A metal oxide semiconductor (MOS) device made by the process comprising:

forming an oxide layer on a silicon substrate;

depositing a polysilicon layer on said oxide layer;

implanting a fluorine dopant into said polysilicon layer at an implant dose of at least about $4\times10^{14}$ atoms/cm$^2$; and thermally annealing said polysilicon layer such that a portion of said fluorine dopant is diffused into said oxide layer to thereby reduce a 1/f noise of said MOS device, said thermally annealing step including maintaining said polysilicon layer at a temperature of between 850° C. and 950° C. for between about 10 and about 60 minutes.

10. The MOS device as recited in claim 9, wherein said MOS device includes an NMOS transistor having an n-type polysilicon gate and fluorine-containing gate dielectric.

11. The MOS device as recited in claim 10, wherein said NMOS transistor has a noise parameter ($K_f$) that is at least about 40 percent lower than a noise parameter for a substantially similar NMOS transistor that does not include said fluorine-containing gate dielectric.

12. The MOS device as recited in claim 11 wherein said $K_f$ is less than about $1.09\times10^{-28}$ Amp-Farad at a frequency of 100 Hz.

13. The MOS device as recited in claim 11, wherein said MOS device is a CMOS device having an area of less than about 18×0.6 $micron^2$ and channel lengths of less than about 0.5 microns.

14. The MOS device as recited in claim 12, wherein said MOS device is a CMOS device having an integrated noise factor (K_int) that is at least about 3 times lower than a substantially similar CMOS device having substantial fluorine-free oxide layers.

15. A method of manufacturing an integrated circuit comprising:

forming a metal oxide semiconductor (MOS) device by the process comprising:

forming an oxide layer on a silicon substrate;

depositing a polysilicon layer on said oxide layer;

implanting a fluorine dopant into said polysilicon layer at an implant dose of at least about $4\times10^{14}$ $atoms/cm^2$; and thermally annealing said polysilicon layer such that a portion of said fluorine dopant is diffused into said oxide layer to thereby reduce a 1/f noise of said MOS device, said thermally annealing step including maintaining said polysilicon layer at a temperature of between 850° C. and 950° C. for between about 10 and about 60 minutes; and interconnecting said MOS device with interconnects to form an operative integrated circuit.

16. The method recited in claim 15, wherein said MOS device is a CMOS device comprising a PMOS and a NMOS transistor, at least one of said transistors having a fluorine-doped gate dielectric layer.

17. The method recited in claim 14, further includes forming a high sheet resistor on a same level as said MOS device, wherein said high sheet resistor includes a counter ion of said fluorine dopant.

18. The method recited in claim 17, wherein said high sheet resistor is formed on a field oxide layer on said silicon substrate.

19. The method recited in claim 18, wherein said field oxide layer is substantial free of said fluorine dopant.

* * * * *

UNITED STATES PATENT AND TRADEMARK OFFICE

CERTIFICATE OF CORRECTION

PATENT NO. : 7,018,880 B2
APPLICATION NO. : 10/744549
DATED : March 28, 2006
INVENTOR(S) : Pinghai Hao et al.

It is certified that error appears in the above-identified patent and that said Letters Patent is hereby corrected as shown below:

Cover Page, Item [75], add to inventors:

Shih-Hsin Ying, Plano, TX (US)

Signed and Sealed this

Second Day of October, 2007

JON W. DUDAS
*Director of the United States Patent and Trademark Office*